PROGRAMMABLE FREQUENCY DIVIDER

Filed Feb. 8, 1968 5 Sheets-Sheet 1

INVENTORS.
SHU-KUANG HO
and JOHN J. KARDASH

BY David M. Keay
AGENT.

INVENTORS.
SHU-KUANG HO
and JOHN J. KARDASH

BY David M. Keay
AGENT.

PROGRAMMABLE FREQUENCY DIVIDER

Filed Feb. 8, 1968 5 Sheets-Sheet 4

INVENTORS.
SHU-KUANG HO
and JOHN J. KARDASH
BY David M. Kay
AGENT.

INVENTORS.
SHU-KUANG HO
and JOHN J. KARDASH
BY David M. Kay
AGENT.

United States Patent Office 3,518,553

Patented June 30, 1970

3,518,553

PROGRAMMABLE FREQUENCY DIVIDER

Shu-Kuang Ho, Chelmsford, and John J. Kardash, Acton, Mass., assignors to Sylvania Electric Products Inc., a corporation of Delaware Filed Feb. 8, 1968, Ser. No. 703,974
Int. Cl. H03k *21/32*
U.S. Cl. 328—48 12 Claims

ABSTRACT OF THE DISCLOSURE

Frequency divider circuit including four bistable stages arranged to count down through a recurring sequence of ten or sixteen combinations of operating states in response to trigger pulses. The bistable stages can be set to any of the ten or sixteen combinations prior to countdown. The circuit includes an output section which produces an output signal when the bistable stages have counted down to either a combination of operating states designating a "2" or a combination designating a "0," the particular combination being controlled by control signals.

Three decade frequency divider circuits are cascaded and additional circuitry is included to provide a divider arrangement which can be programmed to divide by any number up to 999. By employing control signals from the "hundreds" and "tens" divider circuits to the "units" divider circuit the arrangement starts re-setting the dividers to the programmed number when the "hundreds" and "tens" divider circuits are at the "0" designated combination of operating states and the "units" divider circuit reaches the "2" designated combination of operating states during a countdown. Thus, the arrangement is placed in condition to count down again immediately after an output pulse is produced indicating completion of a countdown.

BACKGROUND OF THE INVENTION

This invention relates to frequency divider circuits. More particularly, it is concerned with programmable frequency divider circuits in which the ratio of the output frequency to the input frequency can be varied.

Digital frequency synthesizers are employed in communication systems to provide a range of accurate, discrete, frequencies for communication channels. A digital frequency synthesizer includes a programmable frequency divider which is employed to control the output frequency of a voltage-controlled oscillator and thus select the desired channel. The voltage-controlled oscillator operates to produce output pulses at a particular frequency dependent upon the voltage level at its input. The output pulses are also applied to the frequency divider which produces one output pulse for a preselected number of input pulses. The output frequency of the frequency divider is compared with that of a reference frequency source by a phase detector, and the resulting difference signal is employed to produce the input voltage to the voltagecontrolled oscillator. The number by which the input frequency to the frequency divider is divided by the frequency divider is variable over a wide range in order to provide a wide range of output frequencies.

The frequency divider is, therefore, an important element in digital frequency synthesizers; and it is desirable that for use in modern communication systems it be of small size and operate reliably over a wide range of frequencies with input pulses of short duration.

SUMMARY OF THE INVENTION

A programmable divider circuit in accordance with the present invention includes a plurality of bistable elements each of which is operable in either of two operating states and triggering means operable to change the operating states of the bistable elements. The bistable elements are interconnected by enabling means which are operable to condition the bistable elements so as to enable them to be switched through a predetermined recurring sequence of combinations of operating states by operation of the triggering means. The circuit includes programming means for setting the bistable elements to any combination of operating states of the predetermined sequence of combinations of operating states.

The divider circuit also includes an output circuit means which is connected to the bistable elements and has an output connection and a control connection. The output circuit means is operable to produce a first output signal condition at the output connection when a first control signal condition is present at the control connection and the bistable elements are in a first predetermined combination of operating states and is operable to produce a second output signal condition at the output connection when the first control signal condition is present at the control connection and the bistable elements are in any combination of operating states other than the first predetermined combination. The output means is also operable to produce the first output signal condition at the output connection when a second control signal condition is present at the control connection and the bistable elements are in either the first predetermined combination or a particular second predetermined combination of operating states, and is operable to produce the second output signal condition at the output connection when the second control signal condition is present at the control connection and the bistable elements are in any combination of operating states other than the first predetermined combination or the second predetermined combination of operating states.

In accordance with the invention individual divider circuits may be cascaded to provide a programmable frequency divider having a total number of combinations of operating states which is the product of the number of combinations of each divider circuit in the cascaded arrangement. Interconnecting means between the output connections of the divider circuits and input control means connected to the triggering means of the divider circuits permits the bistable elements of each divider circuit to be switched only while the first output signal condition is present at the output connection of all the preceding divider circuits of lower order. Other interconnecting means between the output connections of the divider circuits and the input control means prevent the bistable elements of each divider circuit other than the divider circuit of lowest order from being switched while the first output signal condition is present at the output connection of that divider circuit and at the output connections of all the divider circuits of higher order. Means are also included for connecting the output connections of all the divider circuits other than the divider circuit of lowest order to the control connection of the output circuit means of the divider circuit of lowest order. This means is operable to produce the second control signal condition at that control connection only when the first output signal condition is present at the output connections of all the divider circuits other than the divider circuit of lowest order.

The output connections of all the divider circuits are connected to a preset control bistable circuit means by means which are operable to condition the preset control bistable circuit means to be switched from a first operating state to a second operating state only when the first output signal condition is present at the output connections of all the divider circuits. The preset control bistable circuit means is connected to the programming means of all the divider circuits by means which are operable to permit the programming means to set the operating states of the bistable elements when the preset control bistable circuit means is in the second operating state.

In each of the divider circuits the enabling interconnections are such as to provide a countdown sequence of operation. A circuit may operate as a full binary counting circuit; that is, the number of combinations of operating states of the circuit equals $2^n$ where $n$ is the number of bistable elements in the circuit. Alternatively, the enabling interconnections can be such as to provide a recurring sequence less than $2^n$. For example, a divider circuit employing four bistable elements may have enabling interconnections such that the circuit acts as a binary-coded decade divider.

BRIEF DESCRIPTION OF THE DRAWINGS

Various objects, features, and advantages of divider circuits in accordance with the invention will be apparent from the following detailed discussion and the accompanying drawings wherein.

DETAILED DESCRIPTION OF THE INVENTION

Figure 1:
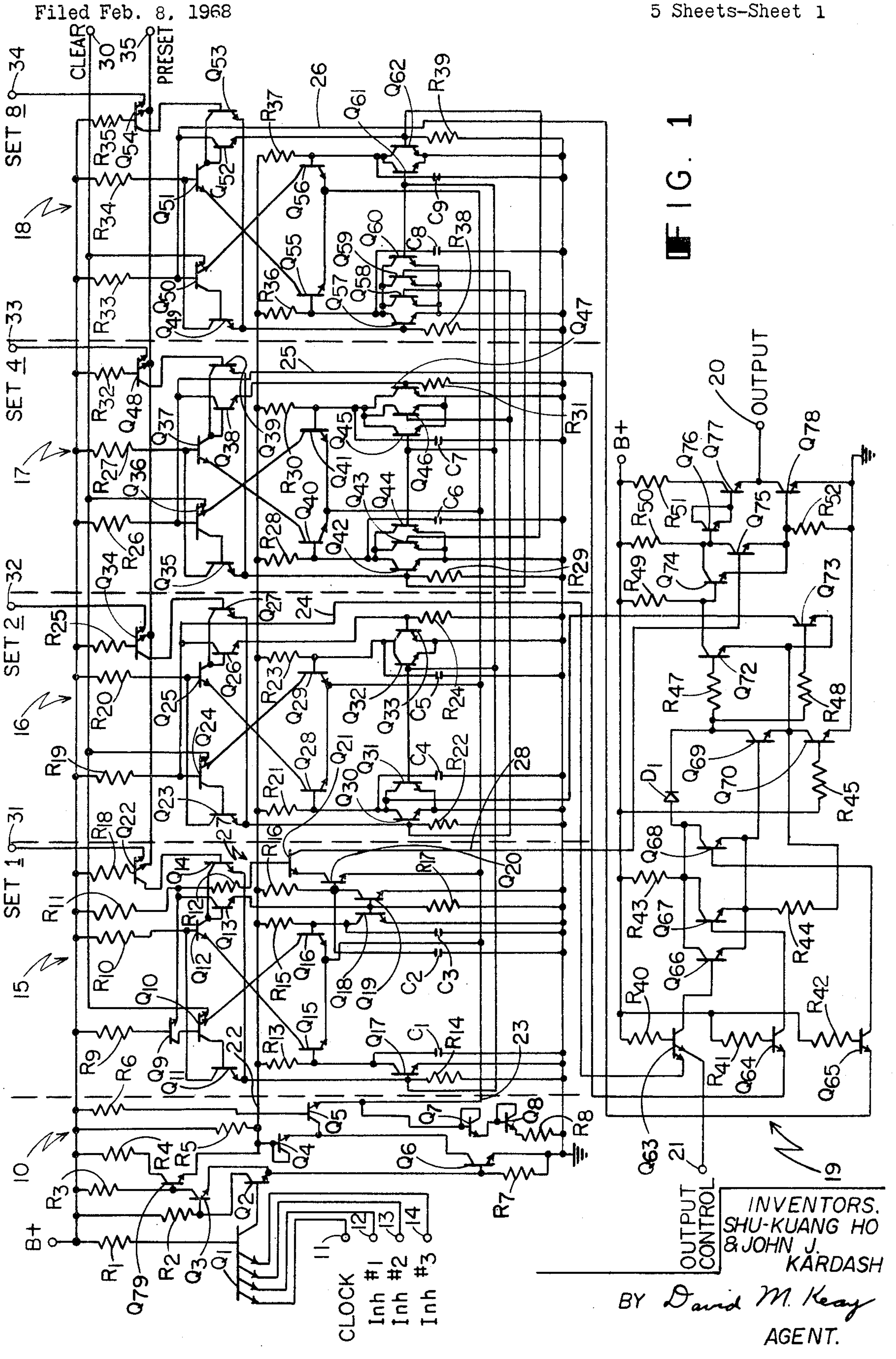
FIG. 1 is a detailed schematic circuit diagram of a decade programmable frequency divider circuit in accordance with the invention.

Decade frequency divider circuit of FIG. 1—General

FIG. 1 is a schematic circuit diagram of a binary-coded decade frequency divider circuit in accordance with the invention. The circuit includes an input control and pulse shaping section 10 having a clock pulse input terminal 11 at which clock pulses are applied and inhibit input terminals 12, 13, and 14 for controlling the input control section. Four bistable stages 15, 16, 17, and 18 are arranged to receive trigger pulses from the input section and to count down continually through a sequence of ten combinations of operating states of the bistable stages to provide a divide-by-ten, or decade, frequency divider. Output connections from the bistable stages are made to an output section 19. The output section produces an output pulse at its output terminal 20 when particular combinations of operating conditions of the circuit occur, the particular combinations being controlled by a control signal at the control terminal 21 of the output section.

Input control and pulse shaping section

The input control and pulse shaping section 10 includes an NPN multiple-emitter input transistor $Q_1$ which provides an AND input gate to the pulse shaper. Positive-going clock pulses applied at the clock pulse input terminal 11 are passed through the AND gate when all of the inhibit input terminals 12, 13, and 14 are either open circuited or have a relatively high voltage level signal applied thereto. Clock pulses are shaped by the pulse shaping circuit to provide positive-going trigger pulses having improved leading and trailing edges. Each trigger pulse appears on the two output lines 22 and 23 from the pulse shaping circuit and is applied to the switching circuitry of the bistable stages 15, 16, 17, and 18.

Bistable stages and interconnections

Each of the bistable stages is a J–K flip-flop circuit of the type described and claimed in application Ser. No. 558,319, filed June 17, 1966, by John J. Kardash entitled "Bistable Logic Circuit" and assigned to the assignee of the present invention. A bistable stage, for example the first stage 15, may be considered to be in the "0" operating state when its first flip-flop transistor $Q_{11}$ is non-conducting and its other flip-flop transistor $Q_{13}$ is conducting. The flip-flop transistors $Q_{11}$ and $Q_{13}$ are maintained in these operating states by connections between their collectors and the bases of the flip-flop input transistors $Q_{12}$ and $Q_{10}$, respectively, associated with the opposite flip-flop transistors. When the operating states are reversed and transistor $Q_{13}$ is non-conducting and transistor $Q_{11}$ is conducting, the bistable stage may be considered to be in the "1" operating state.

The operating state of the bistable stage is reversed by the receipt of a trigger pulse over the lines 22 and 23 from the input control and pulse shaping section 10. The trigger pulse is applied to switching circuitry in the bistable stage. If the switching circuitry is appropriately conditioned for switching, a charge is stored during the trigger pulse. On the trailing edge of the pulse the switching circuitry employs the stored charge to cause the bistable elements of the stage to reverse operating states.

During the occurrence of a positive-going trigger pulse, whichever control transistor $Q_{17}$ or $Q_{18}$ is in the non-conducting condition by virtue of its base being connected to the emitter of the non-conducting flip-flop transistor $Q_{11}$ or $Q_{13}$, respectively, permits a charge to be stored in the base-emitter junction of the associated switching transistor $Q_{15}$ or $Q_{16}$ and also in the associated charge storage capacitance $C_1$ or $C_3$. The control transistor $Q_{17}$ or $Q_{18}$ having its base connected to the emitter of the conducting flip-flop transistor $Q_{11}$ or $Q_{13}$, respectively, is biased into conduction during the positive-going trigger pulse thereby causing current flow through the associated resistance $R_{13}$ or $R_{15}$ and preventing a charge from being stored in the associated switching transistor $Q_{15}$ or $Q_{16}$ and the associated charge storage capacitance $C_1$ or $C_3$. Since the emitters of the switching transistors $Q_{15}$ and $Q_{16}$ are connected to the line 23, the voltage at their emitters increases thereby preventing either of the transistors from becoming conductive during the trigger pulse.

During the trailing edge of the trigger pulse switching transistor $Q_{15}$ or $Q_{16}$ having a charge stored in its base-emitter junction and its associated capacitance $C_1$ or $C_3$ is biased to conduction. Current flowing through the switching transistor $Q_{15}$ or $Q_{16}$ causes current to flow across the base-emitter junction of the flip-flop input transistor $Q_{12}$ or $Q_{10}$ connected to its collector. Current flow through the conducting flip-flop transistor $Q_{13}$ or $Q_{11}$ having its base connected to the collector of the affected flip-flop input transistor is reduced, thereby initiating switching action which reverses the operating states of the flip-flop transistors. The charge stored in the capacitance $C_1$ or $C_3$ serves to sustain conduction in the switching transistor $Q_{15}$ or $Q_{16}$ for a sufficient period to insure switching.

The other three bistable stages 16, 17, and 18 operate in the same manner during each trigger pulse to change operating states when the switching transistor and capacitance associated with the flip-flop transistor is in the non-conducting condition and not prevented from storing the charge. For example, in the second bistable stage 16 when the flip-flop transistor $Q_{23}$ is non-conducting and the flip-flop transistor $Q_{26}$ is conducting, the control transistor $Q_{30}$ is biased to non-conduction. Therefore, during a trigger pulse a charge should be stored in the switching transistor $Q_{28}$ and in the charge storage capacitance $C_4$ so that on the trailing edge of the trigger pulse the operating states of the flip-flop transistors would be reversed. However, if transistor $Q_{31}$, which is connected in parallel with control transistor $Q_{30}$, is biased in a conducting condition, no charge will be stored during the trigger pulse and the flip-flop transistors will not change operating states. The base of transistor $Q_{31}$ is connected directly to the juncture between the base of control transistor $Q_{17}$ and the emitter of the first flip-flop transistor $Q_{11}$ of the first bistable stage 15. Thus, the second bistable stage 16 has an input connection such that it is conditioned to be switched from the "0" operating state (flip-flop transistor $Q_{23}$ non-conducting, flip-flop transistor $Q_{26}$ conducting) to the "1" operating state (flip-flop transistor $Q_{23}$ conducting, flip-flop transistor $Q_{26}$ non-conducting) only when the first bistable stage 15 is in the "0" operating state (flip-flop transistor $Q_{11}$ non-conducting, flip-flop transistor $Q_{13}$ conducting).

Other transistors are similarly connected in parallel with other control transistors and their bases serve as input connections which are appropriately connected to the emitters of flip-flop transistors. Employing the terminology commonly used in conjunction with J–K flip-flop circuits, those input connections to a bistable stage which must be energized by appropriate signals in order to condition the circuit for switching from the "0" operating state to the "1" operating state are designated J input connections and those which must be appropriately energized to condition the bistable circuit for switching from the "1" operating state to the "0" operating state are designated K inputs.

In the divider circuit shown in FIG. 1 the bistable stages are appropriately interconnected so as to condition the stages for switching through a recurring sequence of ten combinations of operating states from 1 0 0 1 (operating states of first, second, hird, and fourth bistable stages 15, 16, 17, and 18, respectively), to 0 0 0 0. The bistable stages 15 16, 17, and 18 may be designated as having values 1, 2, 4, and 8, respectively, when in the "1" operating state. Therefore, the 1 0 0 1 combination of operating states is designated as value 9 and the 0 0 0 0 combination is designated as value 0. The sequence of combinations is a digital countdown in order from the value 9 to the value 0.

Output connections are provided from the second, third, and fourth bistable stages 16, 17, and 18 by output lines 24, 25, and 26 connected directly to the collectors of flip-flop transistors $Q_{26}$, $Q_{38}$, and $Q_{52}$, respectively. The level of the output voltage on a line is relatively high when the respective flip-flop transistor is non-conducting (stage in "1" operating state) and is relatively low when the flip-flop transistor is conducting (stage in "0" operating state).

An output portion 27 of the first bistable stage 15 also provides similar output voltage levels on an output line 28 depending upon the conduction condition of the flip-flop transistors $Q_{11}$ and $Q_{13}$. However, the output portion 27 provides the relatively low output voltage level indicating the stage is in the "0" operating state (transistor $Q_{11}$ nonconducting and transistor $Q_{13}$ conducting) during the trailing edge of the trigger pulse while the bistable stage is in the process of being switched from the "1" operating state to the "0" operating state. Thus, the signal level indicating a "0" operating state is provided immediately without any propagation delay through the elements of the stage.

The output portion 27 operates in the following manner. Since flip-flop transistor $Q_{13}$ is non-conducting when the bistable stage is in the "1" operating state, transistors $Q_{18}$ and $Q_{19}$ are both biased in the non-conducting condition. During a trigger pulse a charge is stored in the switching transistor $Q_{16}$ and its associated charge storage capacitance $C_3$. At the same time, a charge is also stored in the transistor $Q_{20}$ and in its associated charge storage capacitance $C_2$. On the trailing edge of the trigger pulse the charge stored in the base-emitter junction of the switching transistor $Q_{16}$ and in capacitance $C_3$ causes the flip-flop transistors $Q_{11}$ and $Q_{13}$ to reverse operating states in the manner explained previously. Also on the trailing edge of the trigger pulse the transistor $Q_{20}$ is biased to conduction by the charge stored in its base-emitter junction and capacitance $C_2$. Current flows through the transistor $Q_{20}$, across the base-emitter junction of transistor $Q_{21}$, and through resistances $R_{11}$ and $R_{12}$ thereby immediately reducing the voltage at the collector of transistor $Q_{21}$. The charge in capacitance $C_2$ sustains conduction through transistor $K_{20}$ for sufficient time to permit the charge stored in the switching transistor $Q_{16}$ and capacitance $C_3$ to reverse the operating states of the flip-flop transistors and hold the voltage at the output line 28 at the relatively low level.

Output section

The output lines 28, 24, 25, and 26 from the bistable stages are connected to the output section 19 of the divider circuit. The output line 24 from the second bistable stage 16 is connected to one emitter of an AND input transistor $Q_{63}$ which serves as a gate. The other emitter of the AND gate transistor is connected to the output control terminal 21. The output lines 25 and 26 from the third and fourth bistable stages 17 and 18 are connected to the emitters of input transistors $Q_{64}$ and $Q_{65}$, respectively. The collectors of the three input transistors $Q_{63}$, $Q_{64}$, and $Q_{65}$ are connected to the bases of inverting transistors $Q_{65}$, $Q_{67}$ and $Q_{68}$, respectively, arranged in an OR configuration with their collectors and emitters connected in common. The collectors of the OR inverting transistors are connected through a diode $D_1$, which allows transistor $Q_{69}$ to saturate, to the base of another inverting transistor $Q_{72}$. The collector of transistor $Q_{72}$ is connected to the base of transistor $Q_{74}$ which transistor is connected in parallel with a second transistor $Q_{75}$ to provide an OR arrangement. The output line 28 from the first bistable stage 15 is connected to the base of the second OR transistor $Q_{75}$. The transistors $Q_{74}$ and $Q_{75}$ are connected as emitter followers to the base of an output transistor $Q_{78}$ which has its collector connected to the output terminal 20 of the divider circuit. Transistor $Q_{77}$ has its emitter connected to the output terminal 20 and its base connected by means of a diode $Q_{76}$ to the collectors of transistors $Q_{74}$ and $Q_{75}$. Transistor $Q_{77}$ operates as a capacitive load driver to rapidly raise the voltage level at the output terminal when the output transistor $Q_{78}$ is switched from the conducting to the non-conducting condition.

In order for the voltage level at the output terminal 20 to be relatively high (output transistor $Q_{78}$ non-conducting), the voltage levels on the output lines 28, 24, 25, and 26 from the four bistable stages 15, 16, 17, and 18, respectively, must all be relatively low, or the voltage levels on the output lines 28, 25, 26 from the first, third, and fourth bistable stages 15, 17, and 18, respectively, must be relatively low and the voltage level at the output control terminal 21 must be relatively low. If the voltage level on any one of the output lines 28, 25, or 26 from the first, third, or fourth bistable stages 15, 17, or 18, respectively, is high, or if the voltage level on the output line 24 from the second bistable stage 16 is relatively high while the voltage level at the output control treminal 21 is also relatively high, the output transistor $Q_{78}$ will be biased to conduction and the voltage at the output terminal 20 of the output section will be at the relatively low level.

That is, the relatively high voltage level is produced at the output terminal 20 when the four bistable stages are in the 0 0 0 0 (value 0) combination of operating states, or when a relatively low level voltage is applied at the output control terminal 21 and the bistable stages are in the 0 1 0 0 (value 2) combination of operating states. The manner in which this feature is employed will be explained hereinbelow in the discussion of the detailed operation of the frequency divider of FIG. 4.

Since the divider circuit counts down in order, the combinaiton of operating states preceding the 0 0 0 0 combination is 1 0 0 0 (value 1) and the combination preceding the 0 1 0 0 combination is 1 1 0 0 (value 3). In each instance switching of the first bistable stage from the "1" operating state to the "0" operating state completes establishment of the appropriate conditions causing the output section 19 to switch and produce the relatively high voltage at the output terminal 20. The output portion 27 of the first bistable stage 15 provides the enabling signal to the output section section 19 without any propagation delay through the elements of the first bistable stage and eliminates problems of racing and triggering by spurious signals.

The output section 19 also includes a transistor $Q_{73}$ which is connected across the control transistor $Q_{30}$ of the second bistable stage 16. The base of transistor $Q_{73}$ is connected to the collectors of the OR inverting transistors $Q_{66}$, $Q_{67}$, and $Q_{68}$. This arrangement provides a NAND function between the output lines 25 and 26 from the third and fourth bistable stages 17 and 18 and a J input connection to the second bistable stage 16 such that the second bistable stage 16 is prevented from being switched from the "0" operating state to the "1" operating state when the third and fourth bistable stages 17 and 18 are both in the "0" operating state.

Clearing circuitry

The divider circuit may be cleared, that is, all the bistable stages set to the "0" operating state, by the application of a relatively low voltage pulse to the clear terminal 30. Under normal operating conditions a relatively high voltage level is maintained at the clear terminal 30. A low voltage level at the clear terminal 30 forward biases the base-emitter junctions of the flip-flop input transistors $Q_{10}$, $Q_{24}$, $Q_{36}$, and $Q_{50}$. Heavy current flow through the flip-flop input transistors reduces the voltage level at their collectors, thereby reducing conduction through any of the associated first flip-flop transistors $Q_{11}$, $Q_{23}$, $Q_{35}$, and $Q_{49}$ which may be conducting. The switching action goes to completion setting all the bistable stages to the "0" operating state.

Programming circuitry

In order to set the divider circuit to any one of the combinations of operating states selected, bistable stages are individually set to the "1" operating state by means of programming circuitry. Each of the bistable stages includes a set input gate transistors $Q_{22}$, $Q_{34}$, $Q_{48}$, and $Q_{54}$ having one emitter connected to a set input terminal 31, 32, 33, and 34, respectively, and a second emitter connected in common to a preset terminal 35. The collector of each transistor $Q_{22}$, $Q_{34}$, $Q_{48}$, and $Q_{54}$ is connected to the base of an inverting transistor $Q_{14}$, $Q_{27}$, $Q_{39}$, and $Q_{53}$, respectively, which has its collector connected to the base of the second flip-flop transistor and its emitter connected to the emitter of the first flip-flop transistor of the respective bistable stage. Under normal operating conditions a relatively low voltage level is applied to the preset terminal 35 thereby causing the inverting transistors $Q_{14}$, $Q_{27}$, $Q_{39}$, and $Q_{53}$ to be biased in the non-conducting condition.

When a relatively high voltage level pusle is applied to the preset terminal 35 while a relatively high voltage level signal is present at a set input terminal, set input terminal 31 of the first bistable stage, for example, the voltage at the collector of the gate transistor $Q_{22}$ increases and the inverting transistor $Q_{14}$ is biased to conduction. If the bistable stage is in the "1" operating state (transistor $Q_{11}$ conducting and transistor $Q_{13}$ non-conducting), current flow through the inverting transistor $Q_{14}$ has no effect on the operation of the stage other than to increase current flow through resistances $R_{10}$ and $R_{14}$. If the bistable stage is in the "0" operating state (transistor $Q_{11}$ nonconducting and transistor $Q_{13}$ conducting), current flow through the inverting transistor $Q_{14}$ and the resistances $R_{10}$ and $R_{14}$ decreases the voltage on the base of the flip-flop input transistor $Q_{12}$ initiating switching action which reverses the operating state of the bistable stage.

Figure 2:
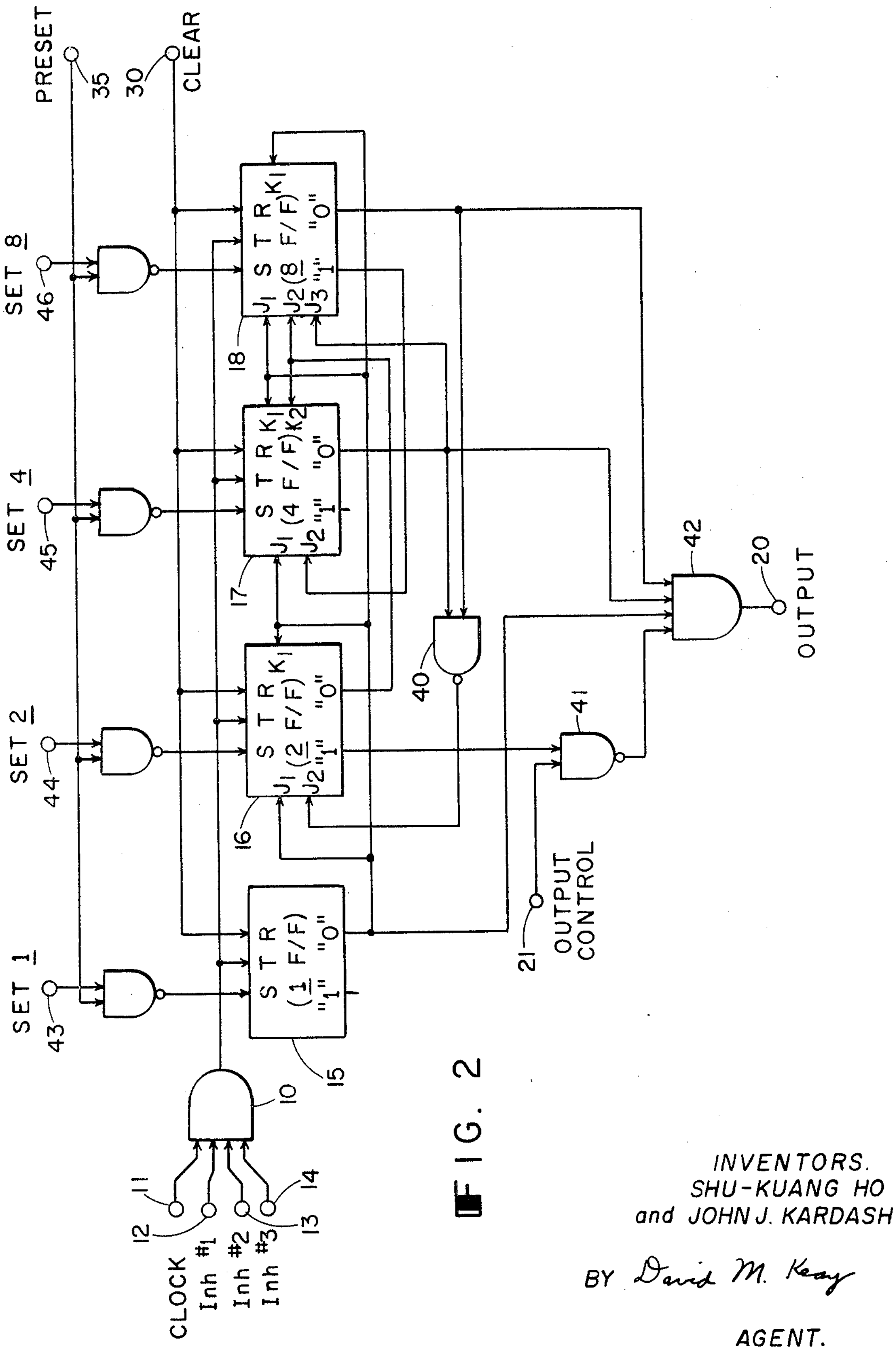
FIG. 2 is an equivalent logic diagram of the divider circuit of FIG. 1.

Decade frequency divider circuit—Logic diagram of FIG. 2

The overall operation of the circuit of FIG. 1 as a programmable frequency divider circuit may more readily be understood by reference to the logic diagram of FIG. 2. In the logic diagram of FIG. 2 certain of the detailed functions performed in the circuit of FIG. 1 have been combined to provide a simplified diagram form which is logically equivalent to the circuit of FIG. 1.

As illustrated in the logic diagram of FIG. 2, the decade frequency divider circuit includes four bistable stages 15, 16, 17, and 18 arranged in order and designating values of 1, 2, 4, and 8, respectively. The bistable stages are J–K flip-flop circuits which are switched from one operating state to the other on the trailing edge of positive-going trigger pulses applied at the trigger input when all of the J or K input connections are appropriately conditioned. Trigger pulses are produced by positive-going clock pulses applied at the clock pulse input terminal 11 of the AND input control gate 10 while the inhibit input terminals 12, 13, and 14 are either open circuited or have appropriate information signals applied thereto in the form of relatively high voltage levels.

The bistable stages are interconnected by connections, including a NAND gate 40, from their outputs to various J and K inputs to cause the circuit to count through a recurring sequence of combinations of operating states of the bistable stages. The circuit counts down in steps of value 1 for each trigger pulse through ten combinations of operating states, the highest being 1 0 0 1 designating a value of 9 and the lowest being 0 0 0 0 designating a value of 0. When the circuit is in the 0 0 0 0 combination of operating states, the next trigger pulse switches the circuit to the 1 0 0 1 combination of operating states.

The output section NAND and AND gates 41 and 42 as shown in FIG. 2 are logically equivalent to the output section 19 of FIG. 1. Thus, when the output control terminal 21 has a relatively high voltage level applied thereto or is open circuited and the bistable stages are in the 0 0 0 0 (value 0) combination of operating states, a relatively high voltage level occurs at the output terminal 20. When the output control terminal 21 has a relatively low voltage level applied thereto and the bistable stages are in either the 0 0 0 0 (value 0) or the 0 1 0 0 (value 2) combination of operating states, the relatively high voltage level occurs at the output terminal 20.

The clear terminal 30 normally has a relatively high voltage level applied thereto. A relatively low voltage level pulse sets the circuit to the 0 0 0 0 (value 0) combination of operating states.

Each of the bistable stages 15, 16, 17, and 18 may be set to the "1" operating state by coincident relatively high voltage levels at the inputs to the set input gates 43, 44, 45, and 46, respectively. Normally a low voltage level signal is applied to the preset terminal 35 so that the information present at the set input terminals 43, 44, 45, and 46 does not affect the counting operation.

In operation, the information to be programmed into the divider by setting the bistable stages is represented by high and low voltage levels appropriately applied at the set input terminals 43, 44, 45, and 46. After the bistable stages have been cleared (all set to the "0" operating state) or are otherwise in the 0 0 0 0 combination of operating states, a positive-going pulse is applied at the preset terminal 35 causing the bistable stages to be set to the proper combination of operating states. Each positive-going clock pulse applied at the clock pulse input terminal 11 while none of the inhibit input terminals 12, 13, and 14 is at a relatively low voltage level produces a positive-going trigger pulse which causes the divider circuit to count down toward the 0 0 0 0 (value 0) combination of operating states. If a low voltage level signal is present at the output control terminal 21 when the 0 1 0 0 (value 2) combination of operating states occur, the voltage at the output terminal 20 rises to a relatively high level. If a high voltage level signal is present at the output control terminal 21 or the terminal is open circuited, the voltage level at the output terminal 20 rises to the relatively high level when the 0 0 0 0 (value 0) combination of operating states occurs. When the circuit is in the 0 0 0 0 combination of operating states, the next trigger pulse switches the bistable stages to the 1 0 0 1 (value 9) combination of operating states in the absence of any signals to preset or clear the circuit.

Figure 3:
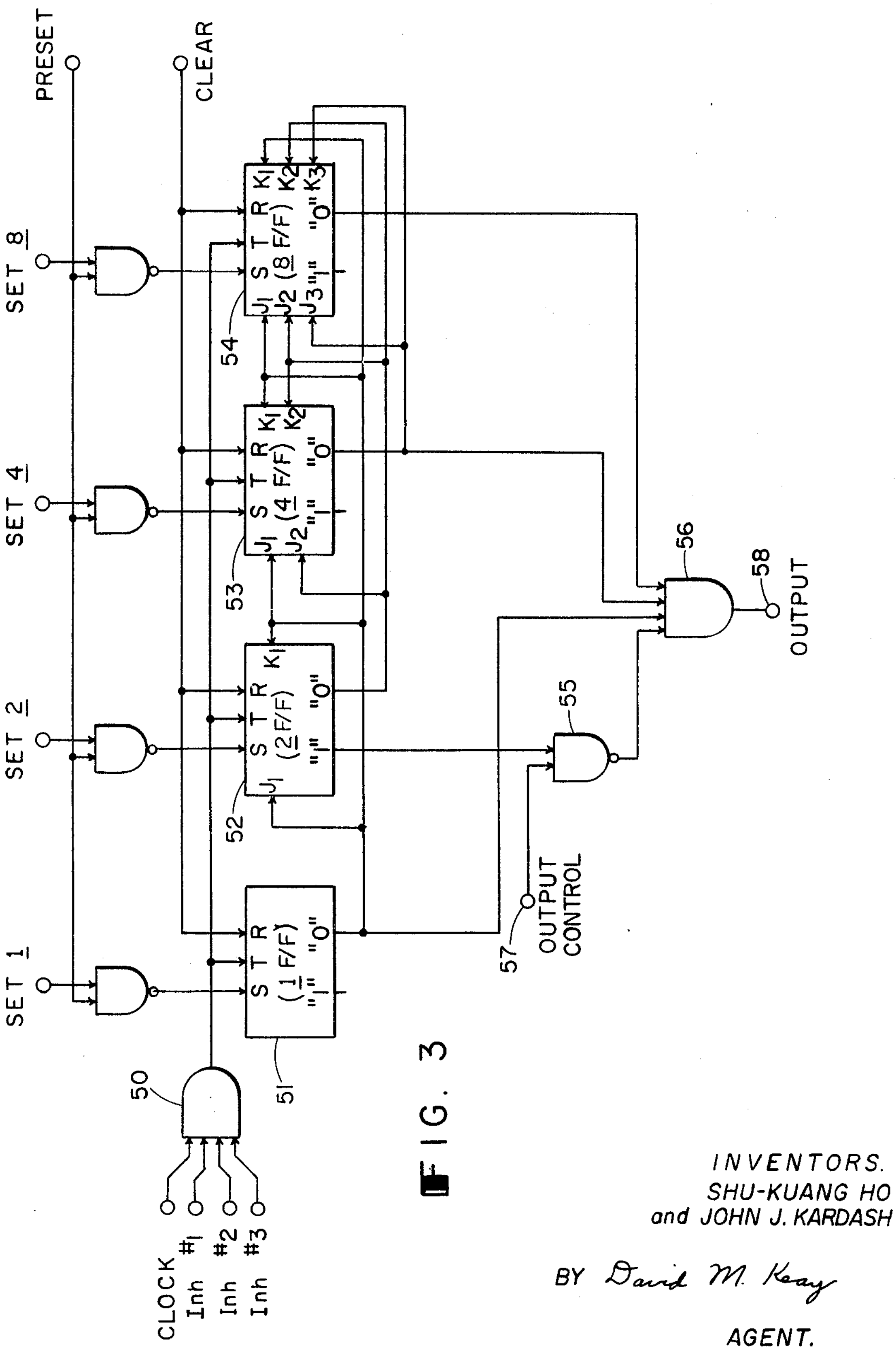
FIG. 3 is an equivalent logic diagram of a binary frequency divider circuit in accordance with the invention.

Binary frequency divider circuit—Logic diagram of FIG. 3

FIG. 3 is a logic diagram of a binary frequency divider circuit similar to the decade frequency divider circuit of FIG. 2 except that it counts through a recurring sequence of sixteen combinations of operating states of the bistable stages rather than ten. The input control and pulse shaping section 50, the individual bistable stages 51, 52, 53, and 54, and the programming circuitry may be the same as those shown in the logic diagram of FIG. 2 and in the circuit diagram of FIG. 1. However, the interconnections between the outputs of the bistable stages and the J and K inputs are such as to establish a recurring sequence of sixteen combinations of operating states to provide a divide-by-16 binary divider. The output section NAND and AND gates 55 and 56 are similar to those in FIG. 2. Certain of the elements in the output section 19 of the circuit of FIG. 1 are not required because the logic function provided by the NAND gate 40 of FIG. 2 is not required.

The binary divider circuit of FIG. 3 operates in a manner similar to that of the decade divider circuit of FIG. 2 to count down toward the value 0 0 0 0 (value 0) combination of operating states from any combination up to and including 1 1 1 1 (value 16) set in the bistable stages by the programming circuitry. If a low voltage level signal is present at the output control terminal 57 when the 0 1 0 0 (value 2) combination of operating states occurs, the voltage at the output terminal rises to a relatively high level. If a high voltage level signal is present at the output control terminal 57 or the terminal is open circuited, the voltage level at the output terminal 58 rises to the relatively high level when the 0 0 0 0 (value 0) combination of operating states occurs.

Figure 4:
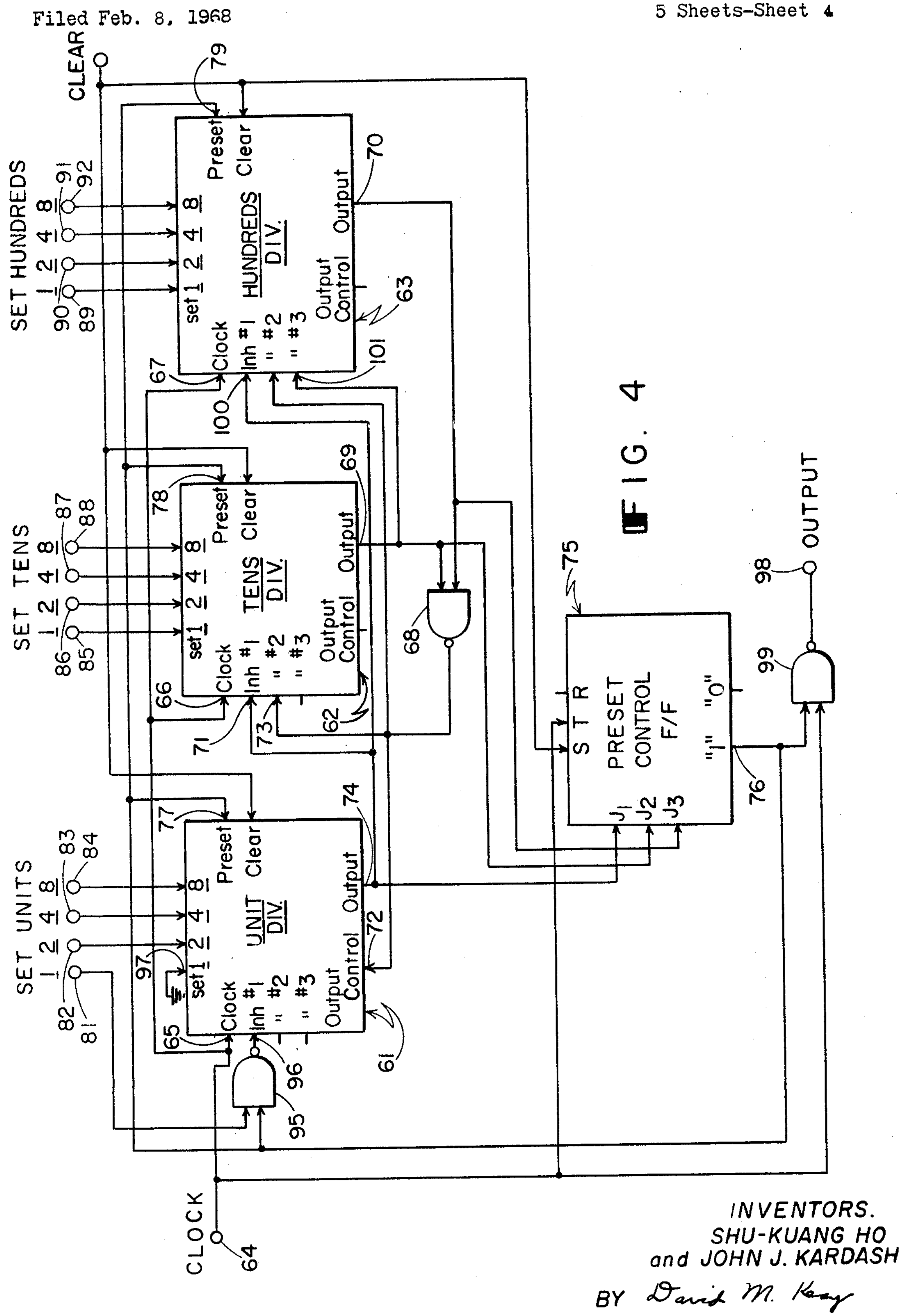
FIG. 4 is a logic diagram of a frequency divider employing three of the divider circuits of the invention in a cascaded arrangement.

Frequency divider of FIG. 4

FIG. 4 is a logic diagram of a frequency divider employing three of the frequency divider circuits as shown in FIGS. 1 and 2 or in FIG. 3 cascaded to provide a frequency divider which is programmable to divide by any number from 2 up to three magnitudes greater than a single divider circuit. With appropriate additional circuitry the apparatus can be expanded to incorporate any desired number of divider circuits. The divider counts down from the combinations of operating states representing the present number to produce an output pulse at value 0. The apparatus automatically resets itself to the number preset in the programming circuitry and then counts down to value 0 again. The divider makes use of certain features of the individual divider circuits described in detail hereinabove to provide reliable operation with clock input pulses of high frequency and short duration.

The divider circuits 61, 62, and 63, each of which may be in the form of a single integrated circuit, are shown arranged in ascending order of magnitude. Clock pulses are applied at a clock input terminal 64 and from there to the clock pulse input terminals 65, 66, and 67 of each of the divider circuits. Each clock pulse triggers a countdown of one step in each of the divider circuits when the voltages at the inhibit input terminals to which connections are made are all at a relatively high level. Interconnections from output terminals to inhibit input terminals are such as to prevent a particular divider circuit from being triggered by a clock pulse except when all divider circuits of lower order are producing relatively high voltage level signals at the output terminals. A NAND control gate 68 having inputs from the output terminals 69 and 70 of the second and third divider circuits 62 and 63 and an output connection to an inhibit input terminal 71 of the second divider circuit 62 prevents a clock pulse from triggering a countdown of the second divider circuit when a relatively high voltage level is present at both the output terminals 69 and 70. An output connection from the NAND control gate 68 to the output control terminal 72 of the first divider circuit 61 presents a relatively low voltage level at the output control terminal 72 when a relatively high voltage level is present at both the output terminals 67 and 70.

After a number has been preset into the frequency divider circuits, clock pulses cause the first frequency divider circuit 61, of lowest order, to count down from the value set therein to the 0 0 0 0 combination of operating states. The next clock pulse causes the second divider circuit 62, of next highest order, to count down by 1 and the first frequency divider circuit to switch to the 1 0 0 1 (value 9) combination of operating states (assuming the divider circuits to be decade divider circuits). Succeeding clock pulses cause the first divider circuit 61 to count down to the 0 0 0 0 combination of operating states. and the next clock pulse again causes the second divider circuit 62 to count down by 1 and the first frequency divider to switch to the 1 0 0 1 (value 9) combination of operating states. This procedure is repeated until the second divider circuit 62 is in the 0 0 0 0 combination of operating states. The clock pulse which switches the second divider circuit 62 to the 0 0 0 0 combination of operating states switches the first divider circuit to the 1 0 0 1 (value 9) combination operating states. The first divider circuit again counts down to the 0 0 0 0 combination of operating states. With both the first and the second divider circuits 61 and 62 in the 0 0 0 0 combination of operating states, the next clock pulse causes the third divider circuit 63 to count down by 1. The same clock pulse also causes both the first and second divider circuits 61 and 62 to switch to the 1 0 0 1 (value 9) combination of operating states.

Operation of the divider circuit continues in this manner until the third divider circuit 63 is in the 0 0 0 0 combination of operating states. The countdown then continues until a clock pulse switches the second divider circuit to the 0 0 0 0 combination of operating states and the first divider circuit 61 to the 1 0 0 1 (value 9) combination of operating states. Since the input connections to the NAND control gate 68 are from the output terminals 69 and 70 of the second and third divider circuits 62 and 63 which are both at the relatively high voltage level, a relatively low voltage level signal is applied to the second inhibit input terminal 73 of the second divider circuit 62 thus preventing that divider circuit from being switched. The relatively low voltage level from the NAND control gate 68 is also applied to the output control terminal 72 of the output section of the first divider circuit 61. Thus, during the next, and last, countdown of the first divider circuit when the 0 1 0 0 (value 2) combination of operating states occurs, a relatively high voltage level signal is produced at the output terminal 74 of the first divider circuit.

With relatively high voltage levels present at the output terminals 74, 69, and 70 of all three divider circuits 61, 62, and 63 the J inputs of a preset control bistable circuits 75 are all conditioned to permit switching of the circuit from the "0" to the "1" operating state. Thus, the next clock pulse causes the first divider circuit 61 to which to the 1 0 0 0 (value 1) combination of operating states and the preset control bistable circuit to switch from the "0" operating state to the "1" operating state. These actions occur on the trailing edge of the clock pulse as explained previously.

The relatively high voltage level from the "1" output terminal 76 of the preset control bistable circuit 75 is applied to the preset terminals 77, 78, and 79 of the three divider circuits. Thus, the programming data represented by the presence or absence of relatively high voltage levels at the data input terminals 82 . . . 92 other than the data input terminal 81 of lowest order to the first divider circuit 61 sets the bistable stages of the divider circuits except for the first bistable stage of the first divider circuit to the desired operating states.

The "1" output terminal 76 of the preset control bistable circuit 75 is also connected to the input of a NAND setting gate 95. The other input to the NAND setting gate is from the data input terminal of lowest order 81 of the first divider circuit. The output of the NAND setting gate is applied to an inhibit input terminal 96 of the first divider circuit 61. The set input terminal 97 of the first bistable stage of the first divider circuit 61 is held at a low voltage level (shown grounded). Thus, if a relatively high voltage level is present at the lowest order data input terminal 81 indicating that the first bistable stage is to be set to the "1" operating state, the high voltage level at the "1" output terminal 76 of the preset control bistable circuit 75 causes a low voltage level to be produced at the inhibit input terminal 96. If a relatively low voltage level is present at the lowest order data input terminal 81 indicating that the first bistable stage is to be set to the "0" operating state, the voltage applied to the inhibit input terminal 96 remains at the high level.

With the first divider circuit 61 in the 1 0 0 0 (value 1) combination of operating states and the preset control bistable circuit in the "1" operating state, the next clock pulse which occurs is the last pulse of the programmed number. If the relatively high voltage level is present at the lowest order data input terminal 81 indicating the first bistable stage is to be set to the "1" operating state, a low voltage level is present at the inhibit input terminal 96 thus inhibiting the clock pulse and preventing the first bistable stage from being switched from the "1" operating state. If the relatively low voltage level is present at the lowest order data input terminal 81 indicating the first bistable stage is to be set to the "0" operating state, the relatively high voltage level remains at the inhibit input terminal 96 permitting the clock pulse to switch the first bistable stage from the "1" operating state to the "0" operating state. Thus, the final clock pulse sets the lowest order bistable stage of the first divider circuit 61 to the proper operating state completing the setting of the stages to the programmed number for the next countdown cycle.

During the final clock pulse of the cycle an output pulse of relatively low voltage level is produced at the divider output terminal 98 by the NAND output gate 99. On the trailing edge of the final clock pulse the preset control bistable circuit 75 is switched from the "1" operating state to the "0" operating state. Thus, the countdown cycle is completed and the divider is set to begin the next cycle.

Frequency divider—Specific example of operation

Figure 5:
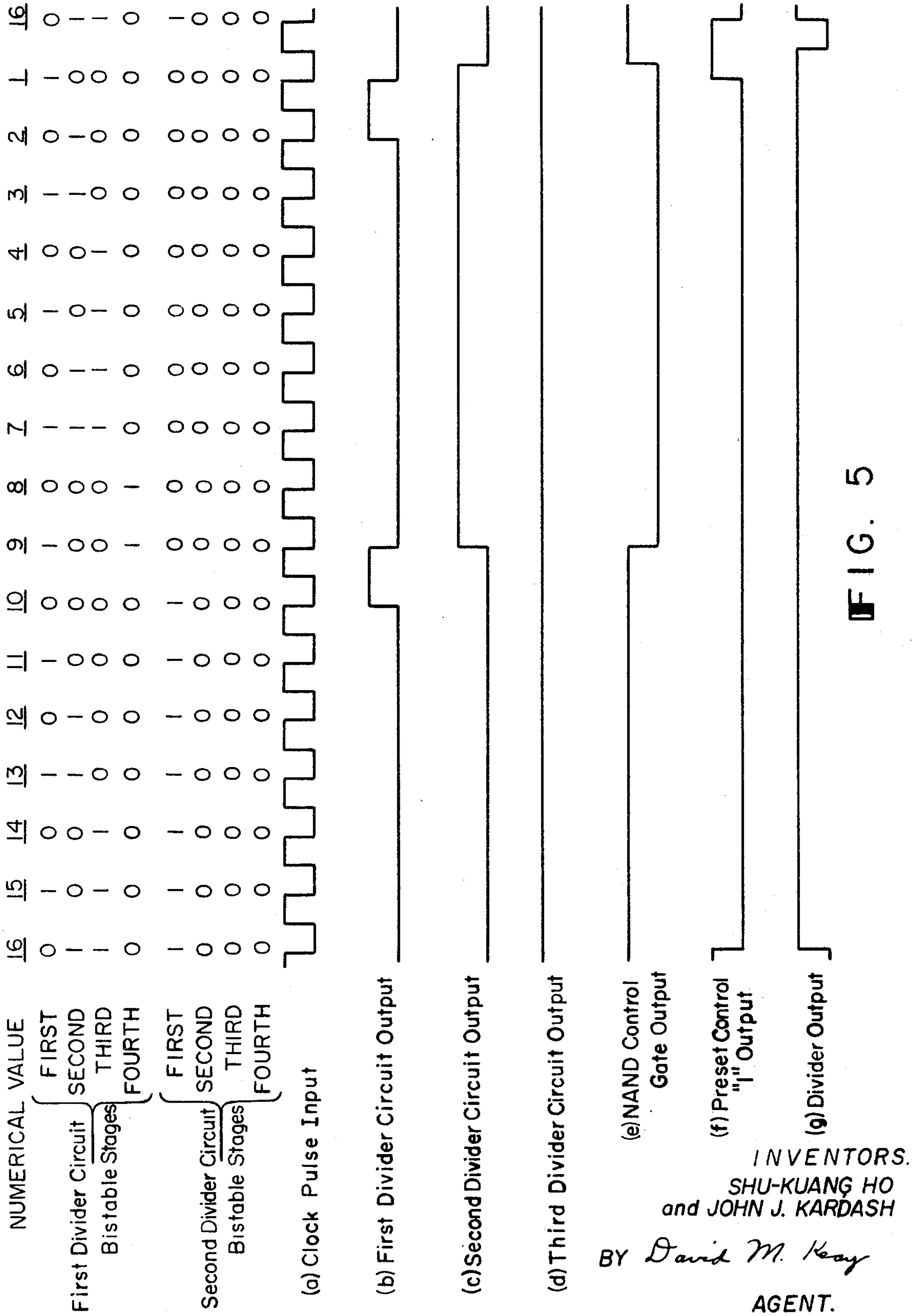
FIG. 5 is a table of operating states and a set of idealized curves of voltage conditions taking place throughout the apparatus represented by the logic diagram of FIG. 4 during an illustrative operating cycle of the apparatus.

Events during an operating cycle of the frequency divider of FIG. 4 are depicted in FIG. 5 which shows idealized curves of voltage levels at certain points in the divider and includes a table indicating the operating states of the individual bistable stages subsequent to each clock pulse in the cycle. For illustrative purposes the apparatus will be described as programmed for a divide-by-16 operation. The units digit (value 6) is entered in the apparatus by presenting the relatively high voltage level at the second and third data input terminals 82 and 83 to the first divider circuit 61. The tens digit (value 1) is entered by presenting the relatively high voltage level at the first data input terminal 85 to the second divider circuit 62. A relatively low voltage level is presented at all the remaining data input terminals of the divider.

The conditions in the apparatus upon termination of the clock pulse [curve (*a*) in FIG. 5] which sets the divider to the programmed value of 16 are as follows. Since there is no hundreds digit entered in the third divider circuit 63, that divider circuit is in the 0 0 0 0 combination of operating states and the voltage at its output terminal 70 is at a relatively high voltage level [curve (*d*) of FIG. 5]. Since the third divider circuit remains in the 0 0 0 0 combination of operating states throughout the cycle, its operating states are not included in the table of operating states in FIG. 5. The output terminals 74 and 69 of both the first and second divider circuits 61 and 62 are at the relatively low voltage level [curves (*b*) and (*c*) of FIG. 5], thus producing inhibiting signals at the first inhibit input terminal 71 of the second divider circuit 62 and at the first and third inhibit input terminals 100 and 101 of the third divider circuit 63. The output of the NAND control gate 68 is at the relatively high voltage level [curve (*e*)] providing an enabling signal at the second inhibit input terminal 73 of the second divider circuit 62 and a relatively high voltage level signal at the output control terminal 72 of the first divider circuit 61. The preset control bistable circuit 75 is in the "0" operating state producing a relatively low voltage level at its "1" output terminal 76 [curve (*f*)]. Thus, a relatively high voltage level enabling signal is present at the inhibit input terminal 96 of the first divider circuit, and a relatively high voltage level is produced at the divider output terminal 98 [curve (*g*)].

The first five clock pulses of the cycle cause the first divider circuit 61 to count down from the 0 1 1 0 (value 6) combination of operating states to the 1 0 0 0 (value 1) combination as shown in the table of FIG. 5. Since at least one inhibit input terminal of each of the other two divider circuits is at the low voltage level, these clock pulses have no effect on the other divider circuits.

On the trailing edge of the sixth clock pulse the first divider circuit 61 is switched to the 0 0 0 0 combination of operating states and the voltage at its output terminal increases to the relatively high voltage level [curve (*b*)] producing an enabling signal at the first inhibit input terminal 71 of the second divider circuit 62. Thus, the seventh clock pulse affects both the first and second divider circuits.

On the trailing edge of the seventh clock pulse the first divider circuit 61 switches to the 1 0 0 1 (value 9) combination of operating states and the second divider circuit 62 switches to the 0 0 0 0 combination of operating states. Thus, the voltage at the output terminal 74 of the first divider circuit 61 returns to the relatively low level [curve (*b*)] and the voltage at the output terminal 69 of the second divider circuit 62 changes to the relatively high level [curve (*c*)]. Since the output terminals 69 and 70 of both the second and third divider circuits 62 and 63 are at the relatively high voltage level [curves (*c*) and (*d*)], the output from the NAND control gate 68 becomes low [curve (*e*)] thereby providing an inhibiting signal at the second inhibit input terminal 73 of the second divider circuit 62 and providing a relatively low voltage level signal at the output control terminal 72 of the first divider circuit 61.

The next six clock pulses cause the first divider circuit 61 to count down from the 1 0 0 1 (value 9) combination of operating states to the 1 1 0 0 (value 3) combination. On the trailing edge of the next clock pulse (the fourteenth pulse in the cycle) the first divider circuit 61 switches to the 0 1 0 0 (value 2) combination of operating states. Since the output control terminal 72 has a relatively low voltage level applied thereto by the NAND control gate 68 [curve (*e*)], switching of the first divider circuit to the 0 1 0 0 combination of operating states causes a relatively high voltage to be produced at its output terminal 74 [curve (*b*)]. Thus, with the output terminals 74, 69, and 70 of all three divider circuits at the relatively high voltage level all the J inputs to the preset control bistable circuit 75 are conditioned to permit switching of that stage by the next clock pulse.

On the trailing edge of the fifteenth clock pulse, the first divider circuit 61 switches to the 1 0 0 0 (value 1) combination of operating states causing the voltage at the output terminal to return to the relatively low level [curve (*b*)]. Also on the trailing edge of the fifteenth clock pulse the preset control bistable circuit 75 switches from the "0" operating state to the "1" operating state producing a high voltage level at its "1" output terminal 76 [curve (*f*)]. This voltage is applied to the NAND output gate 99, the NAND setting gate 95, and the preset terminals 77, 78, and 79 of all the divider circuits. The relatively high voltage level at the preset terminals 77, 78, and 79 gates the programming data applied at the data input terminals 82 . . . 92 as high and low voltage levels into the divider circuits to set all the bistable stages except the lowest order bistable stage in the first divider circuit. Since the programmed number is 16, the second and third bistable stages of the first divider circuit 61 are set to the "1" operating state and the first bistable stage of the second divider circuit 62 is set to the "1" operating state.

During the sixteenth clock pulse a relatively low voltage level is produced at the divider output terminal 98 [curve (*g*)] of the NAND output gate 99. Since a low voltage level is present at the lowest order data input terminal 81 and, therefore, an enabling signal rather than an inhibiting signal is applied to the inhibit input terminal 96 of the first divider circuit by the NAND setting gate 95, the sixteenth clock pulse also affects the first divider circuit. Thus, on the trailing edge of the sixteenth clock pulse the first bistable stage of the first divider circuit switches to the "0" operating state completing the setting of all the divider circuits to the programmed number, 16. Also during the trailing edge of the sixteenth clock pulse the preset control bistable circuit 75 is switched to the "0" operating state. Thus, immediately after the sixteenth clock pulse, which produces a single output pulse at the divider output terminal 98, the divider is in condition for the next cycle of counting down from the programmed number, 16.

While there has been shown and described what are considered preferred embodiments of the present invention, it will be obvious to those skilled in the art that various changes and modifications may be made therein without departing from the invention as defined in the appended claims.

What is claimed is:

1. A divider circuit including in combination a plurality of bistable elements, each being operable in either of two operating states;

triggering means operable to change the operating states of the bistable elements;

enabling means interconnecting the bistable elements and operable to condition the bistable elements to be switched through a predetermined recurring sequence of combinations of operating states by operation of the triggering means;

programming means for setting the bistable elements to any combination of operating states of said predetermined sequence; and output circuit means connected to the bistable elements and having an output connection and a control connection;

said output circuit means including means to produce a first output signal condition at the output connection when a first control signal condition is present at the control connection and the bistable elements are in a first predetermined combination of operating states, and including means to produce a second output signal condition at the output connection when the first control signal is present at the control connection and the bistable elements are in any combination of operating states other than said first predetermined combination; and said output circuit means including means to produce the first output signal condition at the output connection when a second control signal condition is present at the control connection and the bistable elements are in either said first predetermined combination or a second predetermined combination of operating states, and including means to produce the second output signal condition at the output connection when the second control signal condition is present at the control connection and the bistable elements are in any combination of operating states other than said first predetermined combination or said second predetermined combination.

2. A divider circuit in accordance with claim 1 wherein said output circuit means includes a first gating means connected to said control connection and to one of said bistable elements, and having an output connection;

said first gating means being operable to produce a first signal condition at its output connection when said first control signal condition is present at said control connection and said one bistable element is in a first of said two operating states, being operable to produce a second signal condition at its output connection when said first control signal condition is present at said control connection and said one bistable element is in the second of said two operating states, and being operable to produce the first signal condition at its output connection when said second control signal condition is present at said control connection; and a second gating means connected to the output connection of the first gating means, the bistable elements of said plurality of bistable elements other than said one bistable element, and said output connection of the output circuit means;

said second gating means being operable to produce the first output signal condition at said output connection when each of said other bistable elements is in the first of said two operating states and the first signal condition is present at the output connection of said first gating means, and being operable to produce the second output signal condition at said output connection when any of said other bistable elements is in the second of said two operating states or the second signal condition is present at the output connection of said first gating means.

3. A divider circuit in accordance with claim 1 further including input control means connected to said triggering means and operable to produce a triggering pulse to cause the triggering means to change the operating states of the bistable elements in response to the occurrence of a predetermined signal condition at the input thereto.

4. A divider circuit in accordance with claim 3 wherein said triggering means includes a plurality of switching means each connected to an associated one of said bistable elements, and trigger connecting means for applying triggering pulses to each of said plurality of switching means, said plurality of switching means being operable to switch the bistable elements from any combination of operating states of said predetermined sequence of combinations to the next combination of operating states of said predetermined sequence upon termination of a triggering pulse.

5. A divider circuit in accordance with claim 4 wherein said programming means for setting the bistable elements includes.

programming input means for receiving information for setting the bistable elements to any preselected combination of operating states of said predetermined sequence of combinations of operating states, and gating means operable to transfer said information to the bistable elements and set the bistable elements to the preselected combination of operating states.

6. A divider circuit in accordance with claim 5 wherein said input control means includes a clock pulse input terminal for applying clock pulses thereto, a plurality of information input terminals for applying information signals thereto, and gating means connected to said clock pulse input terminal, said information input terminals, and said trigger connecting means and operable to produce a triggering pulse at said trigger connecting means in response to the presence of a clock pulse at the clock pulse input terminal while a predetermined combination of information signals are present at the information input terminals.

7. A circuit arrangement including in combination a plurality of divider circuits in accordance with claim 3 arranged in order;

means for applying clock pulses simultaneously to the input control means of all the divider circuits;

first means interconnecting the output connections of the divider circuits and the input control means and operable to provide the predetermined signal condition at the input to the input control means of each divider circuit only during the occurrence of a clock pulse while said first output signal condition is present at the output connections of all divider circuits of lower order;

second means interconnecting the output connections of the divider circuits and the input control means and operable to prevent the occurrence of the predetermined signal condition at the input to the input control means of each divider circuit other than the divider circuit of lowest order when said first output signal condition is present at the output connection of that divider circuit and at the output connections of all divider circuits of higher order;

means connecting the output connections of all the divider circuits other than the divider circuit of lowest order to the control connection of the output circuit means of the divider circuit of lowest order and operable to produce said second control signal condition at that control connection only when said first output signal condition is present at the output connections of all the divider circuits other than the divider circuit of lowest order;

a preset control bistable circuit means operable in either of two operating states;

means connecting the output connections of all the divider circuits to the preset control bistable circuit means and operable to condition the preset control bistable circuit means for switching from the first operating state to the second operating state only when said first output signal condition is present at the output connections of all the divider circuits;

means for applying clock pulses to said preset control bistable circuit means and operable to switch the bistable circuit means from one operating state to the other when the bistable circuit means is conditioned for switching; and means connecting the preset control bistable circuit means to the programming means of all the divider circuits and operable to permit the programming means to set the operating states of the bistable elements of the divider circuits when the preset control bistable circuit means is in the second operating state.

8. A circuit arrangement in accordance with claim 7 further including an output gate means connected to the preset control bistable circuit means, and means for applying clock pulses to the output gate means and operable to cause the output gate means to produce a predetermined output signal at an output terminal during the occurrence of a clock pulse while the preset control bistable circuit means is in the second operating state.

9. A circuit arrangement including in combination a plurality of divider circuits in accordance with claim 6 arranged in order;

means for applying clock pulses simultaneously to the clock pulse input terminals of all the divider circuits;

first means interconnecting the output connections of the divider circuits and the information input terminals of the input control means and operable to provide the predetermined combination of information signals at the information input terminals of each divider circuit only when said first output signal condition is present at the output connections of all divider circuits of lower order;

second means interconnecting the output connections of the divider circuits and the information input terminals of the input control means and operable to prevent the occurrence of the predetermined combination of information signals at the information input terminals of each divider circuit other than the divider circuit of lowest order when said first output signal condition is present at the output connection of that divider circuit and at the output connections of all divider circuits of higher order;

means connecting the output connections of all the divider circuits other than the divider circuit of lowest order to the control connection of the output circuit means of the divider circuit of lowest order and operable to produce said second control signal condition at that control connection only when said first output signal condition is present at the output connections of all the divider circuits other than the divider circuit of lowest order;

a preset control bistable circuit operable in either of two operating states, said preset control bistable circuit including a switching means operable to change the operating state of the preset control bistable circuit upon termination of a clock pulse applied to a clock pulse input terminal;

means connecting the output connections of all the divider circuits to the preset control bistable circuit and operable to condition the preset control bistable circuit for switching from the first operating state to the second operating state only while said first output signal condition is present at the output connections of all the divider circuits;

means for applying clock pulses to the clock pulse input terminal of the preset control bistable circuit; and presetting means including interconnecting means connecting the preset control bistable circuit to the gating means of the programming means of all the divider circuits, said presetting means being operable to permit the programming means to set the operating states of the bistable elements of the divider circuits when the preset control bistable circuit is in the second operating state.

10. A circuit arrangement in accordance with claim 9 further including an output gate circuit connected to the preset control bistable circuit and having a clock pulse input terminal and an output terminal, and means for applying clock pulses to the clock pulse input terminal of the output gate circuit, said output gate circuit being operable to produce a predetermined output signal at the output terminal during the occurrence of a clock pulse at the clock pulse input terminal while the preset control bistable circuit is in the second operating condition.

11. A circuit arrangement in accordance with claim 9 wherein the bistable elements of the divider circuit of lowest order are in said first predetermined combination of operating states when each of the bistable elements is in a first operating state and are in said second predetermined combination of operating states when a first bistable element is in the second operating state and the other bistable elements of the divider circuit are in the first operating state, the next combination of operating states following said second predetermined combination is an intermediate predetermined combination of operating states during which a second bistable element is in the second operating state and the other bistable elements of the divider circuit are in the first operating state, and the next combination of operating states following said intermediate predetermined combination of operating states is said first predetermined combination; and said presetting means includes means connecting the preset control bistable circuit to the gating means of the programming means of all the divider circuits and operable to cause the gating means to transfer information at the programming input means to all the bistable elements of the divider circuits other than said second bistable element of the divider circuit of lowest order when the preset control bistable circuit is in the second operating state; and means connected to the preset control bistable circuit, the programming input means of the divider circuit of lowest order, and an information input terminal of the input control means of the divider circuit of lowest order; said means being operable to prevent the occurrence of the predetermined combination of information signals at the information input terminals of the input control means of the divider circuit of lowest order when said second bistable element of the divider circuit of lowest order is to be set to the second operating state and the preset control bistable circuit is in the second operating state.

12. A circuit arrangement in accordance with claim 11 further including an output gate circuit connected to the preset control bistable circuit and having a clock pulse input terminal and an output terminal, and means for applying clock pulses to the clock pulse input terminal of the output gate circuit, said output gate circuit being operable to produce a predetermined output signal at the output terminal during the occurrence of a clock pulse at the clock pulse input terminal while the preset control bistable circuit is in the second operating condition.

References Cited

UNITED STATES PATENTS

| | | | |
|---|---|---|---|
| 3,375,449 | 3/1968 | Ribour | 328—48 |
| 3,390,340 | 6/1968 | Newman et al. | 328—48 |
| 3,395,352 | 7/1968 | McCammon | 328—48 X |
| 3,443,071 | 5/1969 | Petzold | 328—48 X |

JOHN S. HEYMAN, Primary Examiner

U.S. Cl. X.R.

328—42, 45